(12) United States Patent  
Tu et al.

(10) Patent No.: US 9,312,402 B2
(45) Date of Patent: Apr. 12, 2016

(54) MICRO OPTICAL PACKAGE STRUCTURE WITH FILTRATION LAYER AND METHOD FOR MAKING THE SAME

(71) Applicant: LINGSEN PRECISION INDUSTRIES, LTD., Taichung (TW)

(72) Inventors: Ming-Te Tu, Taichung (TW); Yao-Ting Yeh, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

(21) Appl. No.: 14/171,328

(22) Filed: Feb. 3, 2014

(65) Prior Publication Data

US 2015/0187963 A1    Jul. 2, 2015

(30) Foreign Application Priority Data

Dec. 27, 2013   (TW) .............................. 102148863 A

(51) Int. Cl.
| H01L 33/00 | (2010.01) |
| H01L 31/0203 | (2014.01) |
| H01L 31/173 | (2006.01) |
| H01L 31/18 | (2006.01) |

(52) U.S. Cl.
CPC .......... *H01L 31/0203* (2013.01); *H01L 31/173* (2013.01); *H01L 31/18* (2013.01); *H01L 2224/48091* (2013.01); *H01L 2224/48227* (2013.01); *H01L 2924/181* (2013.01); *Y02P 70/521* (2015.11)

(58) Field of Classification Search
CPC .................... H01L 27/14621; H01L 31/02162
USPC ............................................... 257/98, 99, 100
See application file for complete search history.

(56) References Cited

U.S. PATENT DOCUMENTS

| 2008/0054804 A1* | 3/2008 | Kitamura et al. .............. 313/512 |
| 2008/0179609 A1* | 7/2008 | Trottier et al. .................. 257/98 |
| 2010/0181578 A1* | 7/2010 | Li et al. .............................. 257/82 |
| 2011/0012218 A1* | 1/2011 | Monma et al. ................. 257/432 |
| 2013/0240717 A1* | 9/2013 | Yamanobe et al. ....... 250/227.11 |
| 2014/0167005 A1* | 6/2014 | Kim et al. ........................ 257/40 |

* cited by examiner

*Primary Examiner* — Tan N Tran
(74) *Attorney, Agent, or Firm* — Muncy, Geissler, Olds & Lowe, P.C.

(57) ABSTRACT

A micro optical package structure with filtration layers includes a substrate having a light-emitting area and a light-receiving area, a light-emitting chip being deposited in a light-emitting area, a light-receiving chip being deposited in a light-receiving area, two packaging resin bodies for enclosing the light-emitting chip and the light-receiving chip, respectively, and being separately deposited in the light-emitting area and the light-receiving area, respectively, and the filtration layers formed on the packaging resin bodies surface for filtering out lights of different wavelengths. The micro optical package structure needs neither barrier nor protective cover between or outside the packaging resin bodies, so can be microminiaturized. The micro optical package structure can filter out visible lights of specific wavelengths without using any additional filters.

19 Claims, 7 Drawing Sheets

MICRO OPTICAL PACKAGE STRUCTURE WITH FILTRATION LAYER AND METHOD FOR MAKING THE SAME

BACKGROUND OF THE INVENTION

1. Technical Field

The present invention relates to optical package structures, and more particularly to a micro optical package structure having filtration layers and a method for making the micro optical package structure.

2. Description of Related Art

Nowadays, electronic technology changes with each passing day, in which optical sensing particularly has extensive applications for, such as, fingerprint or iris recognition, and ambient or incident light sensing.

FIG. 1 shows a conventional optical package structure 1, which comprises a substrate 2, a light-emitting chip 3, a light-receiving chip 4, and a package shell 5. The light-emitting chip 3 and the light-receiving chip 4 are deposited on the substrate 2. The package shell 5 covers the light-emitting chip 3 and the light-receiving chip 4, and is connected with the substrate 2. For preventing interference acting on the light-receiving chip 4 caused by scattering or diffraction of the light emitted by the light-emitting chip 3, a partition 6 is provided in the package shell 5 for separating the light-emitting chip 3 from the light-receiving chip 4. Thereby, the light emitted by the light-emitting chip 3 is blocked by the partition 6 and prevented from going to the light-receiving chip 4 through scattering or diffraction, so as to improve the sensitivity of the light-receiving chip 4. While such an optical package structure 1 does have the light-emitting chip 3 and the light-receiving chip 4 separated, the existence of the package shell 5 containing the partition 6 is necessary, so of the optical package structure 1 is limited and this is against the trend of modern optical packaging toward compactness and microminiaturization.

In addition to scattering or diffraction of the light emitted by the light-emitting chip 3, another factor degrading the optical sensitivity of the light-receiving chip 4 is visible lights of different wavelengths (380 nm to 780 nm). As shown in FIG. 2, in another conventional optical package structure 1', for preventing visible lights from degrading the sensitivity, filters 9 are installed over the light-emitting aperture 7 and the light-receiving aperture 8 of the package shell 5, so as to filter out visible lights of different wavelengths and improve the recognition of the light-receiving chip 4 of the optical package structure 1'. However, the addition of the filter 9 is not only adverse to microminiaturization of the optical package structure 1', but also requires additional processing steps and increased material costs, thus being disadvantageous.

To sum up, the conventional optical package structures 1, 1' are imperfect and need to be improved.

BRIEF SUMMARY OF THE INVENTION

The primary objective of the present invention is to provide a micro optical package structure having filtration layers. The micro optical package structure needs neither barrier nor protective cover between or outside the packaging resin bodies, so can be microminiaturized. The micro optical package structure can filter out visible lights of specific wavelengths without using any additional filters.

For achieving the above-mentioned objective, the disclosed micro optical package structure comprises a substrate, a light-emitting chip, a light-receiving chip, two packaging resin bodies and the filtration layers. The substrate has a light-emitting area and a light-receiving area. The light-emitting chip and the light-receiving chip are deposited in the light-emitting area and the light-receiving area, respectively. The packaging resin bodies enclose the light-emitting chip and the light-receiving chip, respectively, and are separately deposited in the light-emitting area and the light-receiving area, respectively. The filtration layers are formed on surfaces of the packaging resin bodies, for filtering out lights of different wavelengths.

Therein, the filtration layers have a light-emitting aperture and a light-receiving aperture over the light-emitting chip and the light-receiving chip, respectively.

Therein, the light-emitting aperture and the light-receiving aperture are round, square or polygonal.

Therein, only one of the packaging resin bodies has a light-condensing unit or each of the packaging resin bodies has a light-condensing unit.

Therein, the filtration layer has a light-emitting aperture, and the light-emitting aperture is over the light-emitting chip.

Therein, the filtration layer has a light-receiving aperture, and the light-receiving aperture is over the light-receiving chip.

A micro optical package structure having a filtration layer comprises: a substrate, having a light-emitting area; a light-emitting chip, being deposited in the light-emitting area; a packaging resin body, being formed in the light-emitting area and enclosing the light-emitting chip; and the filtration layer, formed on a surface of the packaging resin body, for filtering out lights of different wavelengths.

Therein, the filtration layer has a light-emitting aperture, and the light-emitting aperture is over the light-emitting chip.

A micro optical package structure having a filtration layer comprises: a substrate, having a light-receiving area; a light-receiving chip, being deposited in the light-receiving area; a packaging resin body, being formed in the light-receiving area and enclosing the light-receiving chip; and the filtration layer, formed on a surface of the packaging resin body, for filtering out lights of different wavelengths.

Therein, the filtration layer has a light-receiving aperture, and the light-receiving aperture is over the light-receiving chip.

Therein, the filtration layer is electrically conductive.

Therein, the filtration layer is opaque.

A method for making the micro optical package structure having the filtration layers comprises the following steps: providing the substrate and defining the light-emitting area and the light-receiving area; providing the light-emitting chip and the light-receiving chip in the light-emitting area and the light-receiving area, respectively; providing the packaging resin bodies to enclose the light-emitting chip and the light-receiving chip; and forming the filtration layers on the surfaces of the packaging resin bodies.

The method further comprises a step of providing at least one mask on the surface of each of the packaging resin bodies over the light-emitting chip or the light-receiving chip, and removing the at least one mask after the filtration layer is formed.

The method further comprises a step of pre-providing a light-condensing unit to only one of the packaging resin bodies or to both of the packaging resin bodies.

Therein, the filtration layers are formed on the surfaces of the packaging resin bodies using a transfer method, an adhesion method, a coating method, a spraying method, a deposition method or a sputtering method.

Therein, the packaging resin bodies are formed using a compression-molding process to enclose the light-emitting chip and the light-receiving chip.

Thereby, the disclosed micro optical package structure and the method for making it can prevent interference caused by the light emitted by the light-emitting chip from reaching the light-receiving chip through scattering or diffraction without using any barriers or protective covers between or outside the packaging resin bodies, and can be microminiaturized. In addition, with the filtration layers formed on the packaging resin bodies, the micro optical package structure can filter out visible lights of specific wavelengths without additionally installing filters over the light-emitting aperture and the light-receiving aperture, so is helpful to simplify the manufacturing process and save manufacturing costs.

For further illustrating the means and functions by which the present invention achieves the certain objectives, the following description, in conjunction with the accompanying drawings and preferred embodiments, is set forth as below to illustrate the implement, structure, features and effects of the subject matter of the present invention.

BRIEF DESCRIPTION OF THE SEVERAL VIEWS OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

The following preferred embodiments when read with the accompanying drawings are made to clearly exhibit the above-mentioned and other technical contents, features and effects of the present invention.

Figure 1:
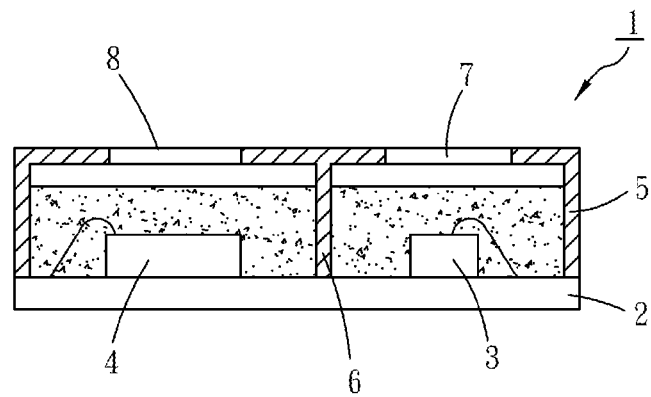
FIG. 1 is a cross-sectional view of a conventional optical package structure.
Figure 2:
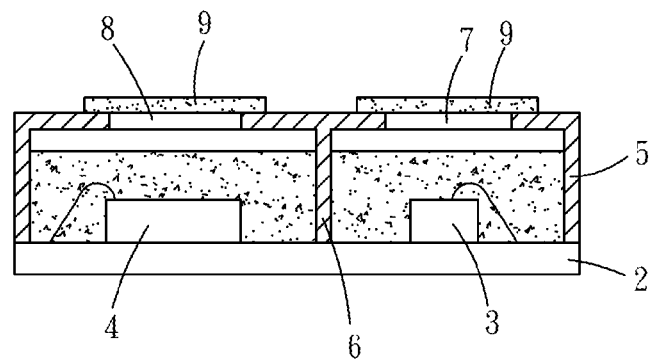
FIG. 2 is a cross-sectional view of another conventional optical package structure having filters.
Figure 3:
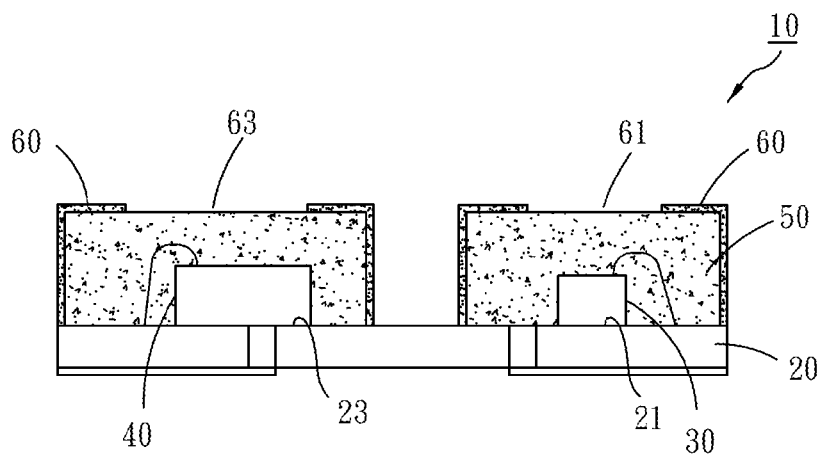
FIG. 3 is a cross-sectional view of a micro optical package structure having filtration layers according to a first preferred embodiment of the present invention.
Figure 4A:
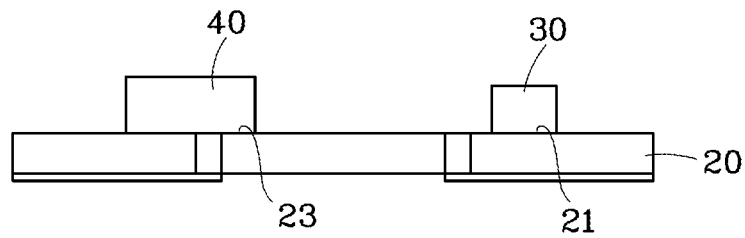
FIG. 4A through FIG. 4F illustrate a method for making the micro optical package structure of the first preferred embodiment.
Figure 4B:
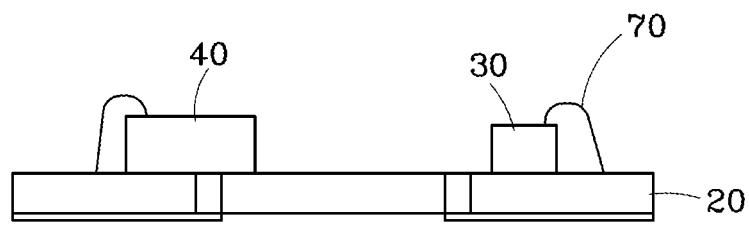
Figure 4C:
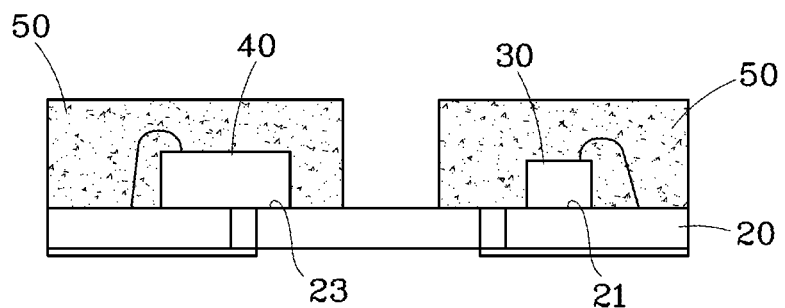
Figure 4D:
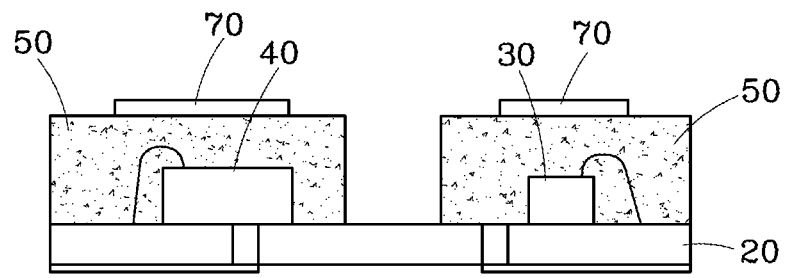
Figure 4E:
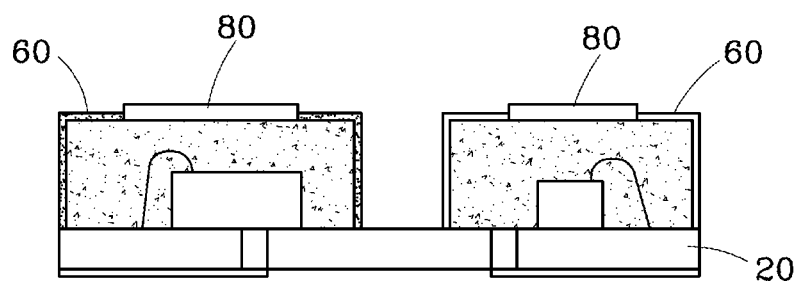
Figure 4F:
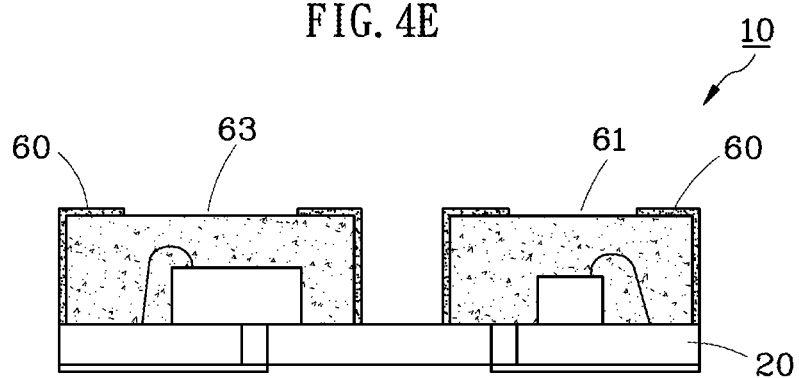

Referring to FIG. 3, a micro optical package structure 10 having the filtration layers according to a first preferred embodiment of present invention is depicted and has the following components.

A substrate 20 has a light-emitting area 21 and a light-receiving area 23.

A light-emitting chip 30 is deposited in the light-emitting area 21.

A light-receiving chip 40 is deposited in the light-receiving area 23.

Two packaging resin bodies 50 enclose the light-emitting chip 30 and the light-receiving chip 40, respectively, and are separately deposited in the light-emitting area 21 and the light-receiving area 23, respectively.

The filtration layers 60 are formed on the surfaces of the packaging resin bodies 50, for filtering out lights of different wavelengths. Therein, the filtration layers 60 may be made of a light-filtering material, an electrically conductive material or an opaque material. Where the filtration layers 60 are made of an electrically conductive material, they can prevent electromagnetic interference (EMI). Where the filtration layers 60 are opaque, they can effectively block external lights outside.

FIG. 4 illustrates a method for making the micro optical package structure 10 of the first preferred embodiment, and the method comprises the following steps:

Step A: providing the substrate and defining the light-emitting area and the light-receiving area, and providing the light-emitting chip and the light-receiving chip in the light-emitting area and the light-receiving area, respectively;

Step B: providing wire bonds 70 to electrically connect the substrate 20 with the light-emitting chip 30 and the light-receiving chip 40;

Step C: molding the packaging resin bodies 40 through a compressing molding process to enclose the light-emitting chip 30 and the light-receiving chip 40, wherein the step may including synchronously providing a light-condensing unit 51 to each or both of the packaging resin bodies 50;

Step D: providing at least one mask 80 to the surface each of the packaging resin bodies 50, with the mask 80 over the light-emitting chip 30 or the light-receiving chip 40;

Step E: forming the filtration layers 60 on the surfaces of the packaging resin bodies 50, wherein in the first preferred embodiment, the filtration layers 60 are formed on the surfaces of the packaging resin bodies 50 using a transfer method, an adhesion method, a coating method, a spraying method, a deposition method or a sputtering method; and Step F: removing the at least one mask 80.

Figure 5A:
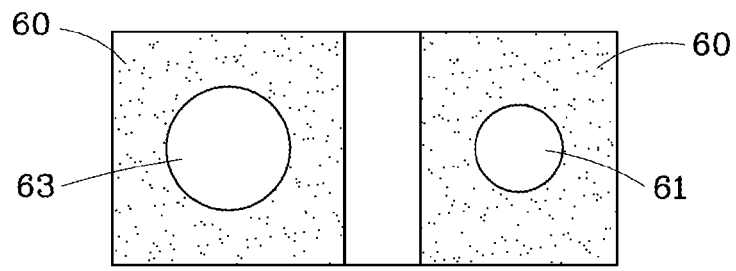
FIG. 5A through FIG. 5D are top views of the micro optical package structure of the first preferred embodiment, showing masks of different shapes for making the filtration layers of different shapes.
Figure 5B:
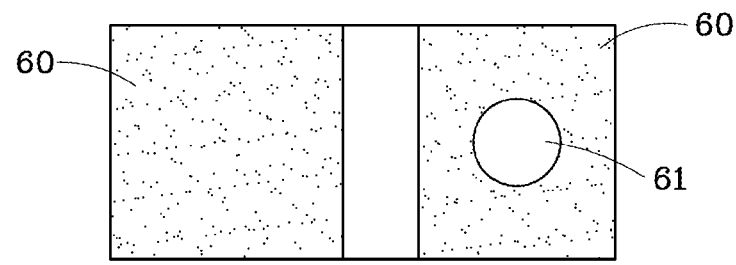
Figure 5C:
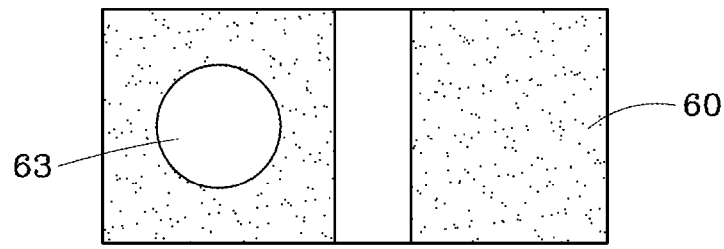
Figure 5D:
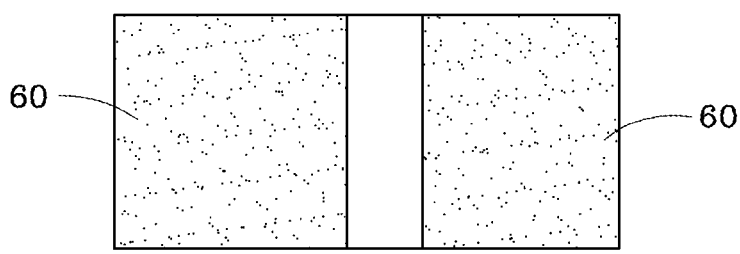
Figure 6A:
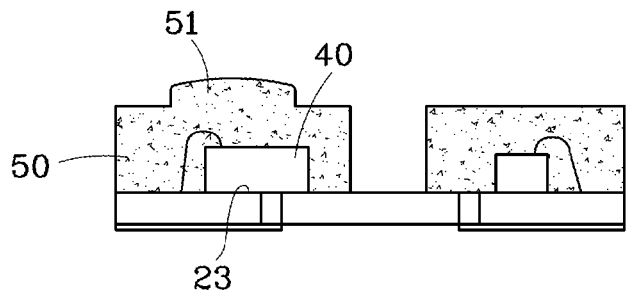
FIG. 6A through FIG. 6H are cross-sectional views of the micro optical package structure of the first preferred embodiment, showing the packaging resin bodies having light-condensing units of different shapes.
Figure 6B:
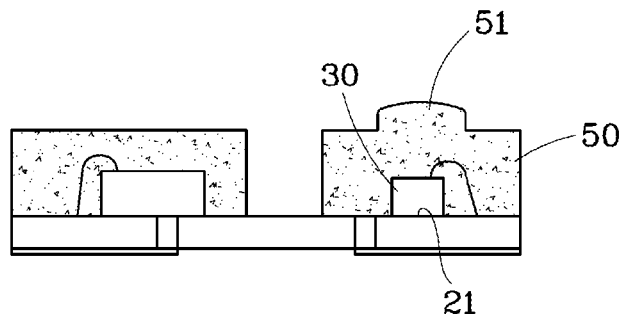
Figure 6C:
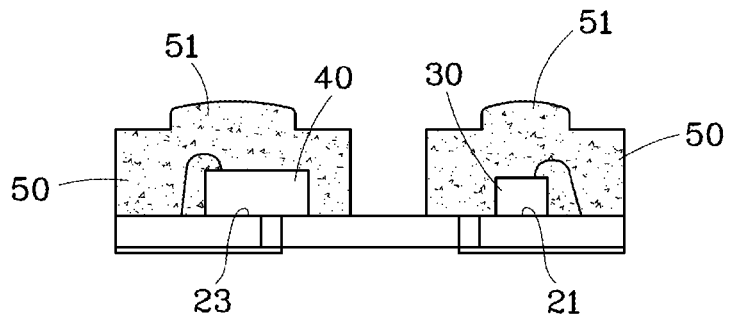
Figure 6D:
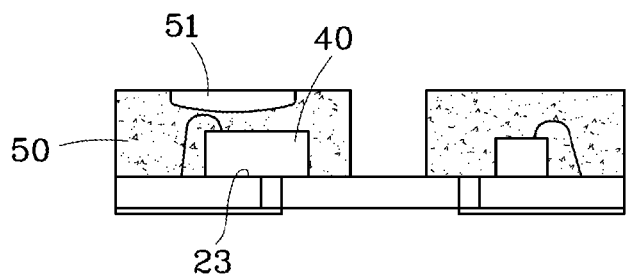
Figure 6E:
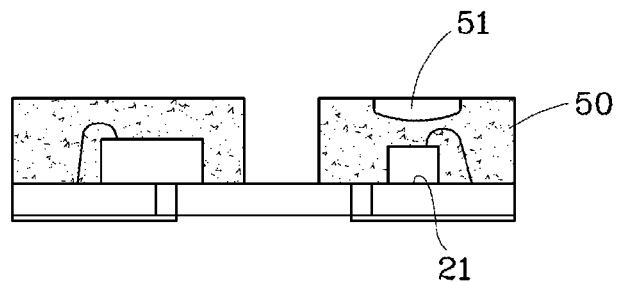
Figure 6F:
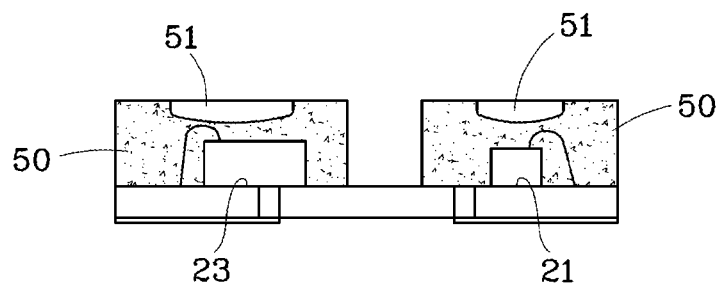
Figure 6G:
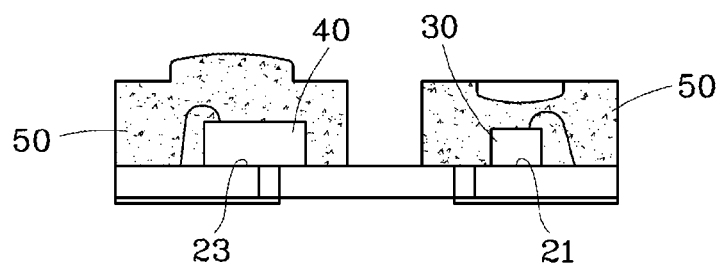
Figure 6H:
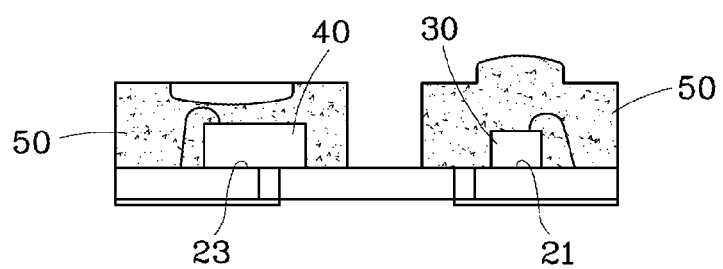

In the first preferred embodiment of the present invention, the filtration layers have a light-emitting aperture 61 and a light-receiving aperture 63 that are located over the light-emitting chip 30 and the light-receiving chip 40, respectively. The light-emitting aperture 61 and the light-receiving aperture 63 herein are round, but may alternatively be of other shapes without limitation. According to optimized designs, they may be square or polygonal. It is to be noted that the filtration layers 60 of the disclosed micro optical package structure 10 may alternatively be in the forms as shown in FIG. 5. Referring to FIG. 5A, the filtration layers 60 have the light-emitting aperture 61 and the light-receiving aperture 63, which are over the light-emitting chip 30 and the light-receiving chip 40, respectively. Referring to FIG. 5B and FIG. 5C, only one of the filtration layers 60 corresponding to the light-emitting chip 30 or the light-receiving chip 40 has the light-emitting aperture 61 or the light-receiving aperture 63. Alternatively, as shown in FIG. 5D, the filtration layers 60 have neither the light-emitting aperture 61 nor the light-receiving aperture 63, so as to provide the function of filtering lights of specific wavelengths.

Referring to FIG. 6, each of the packaging resin bodies 50 of the micro optical package structure 10 of the present invention has the light-condensing unit 51. The light-condensing unit 51 is configured as a convex lens or a concave lens. As shown in FIG. 6A and FIG. 6B, the convex-lens light-condensing unit 51 is only formed on the packaging resin body 50 enclosing the light-receiving chip 40, or is only formed on the packaging resin body 50 enclosing the light-emitting chip 30. As shown in FIG. 6C and FIG. 6F, a convex-lens or concave-lens light-condensing unit 51 is formed on both of the packaging resin bodies 50. As shown in FIG. 6D and FIG. 6E, the concave-lens light-condensing unit 51 is only formed on the packaging resin body 50 enclosing the light-receiving chip 40, or is only formed on the packaging resin body 50 enclosing the light-emitting chip 30. Alternatively, as or shown in FIG. 6G and FIG. 6H, a convex-lens light-condensing unit 51 and a concave-lens light-condensing unit 51 are formed on the packaging resin bodies 50, respectively. Thereby, the present invention selectively uses different configurations of the light-condensing unit(s) 51 formed on the packaging resin bodies 50 to optimize the performance of the light-emitting chip and the light-receiving chip.

Figure 7:
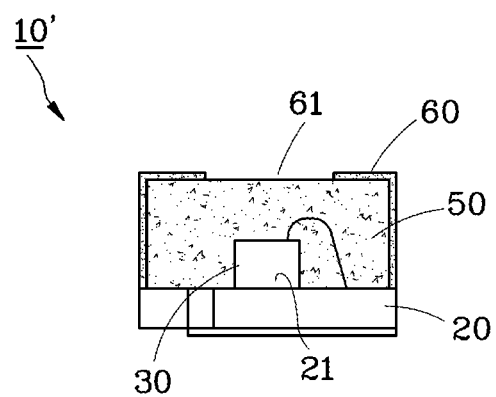
FIG. 7 is a cross-sectional view of a micro optical package structure having a filtration layer according to a second preferred embodiment of the present invention, showing it having only a light-emitting package.
Figure 8:
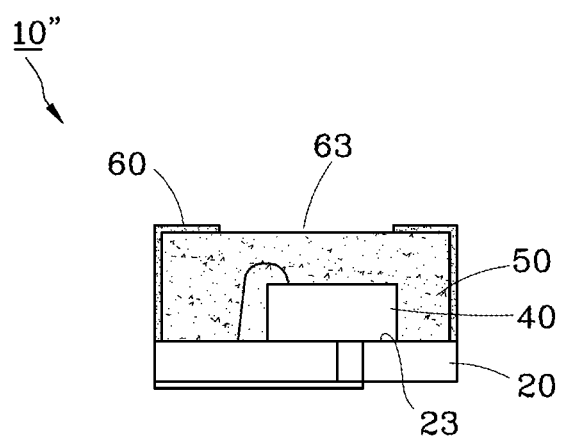
FIG. 8 is a cross-sectional view of a micro optical package structure having a filtration layer according to a third preferred embodiment of the present invention, showing it having only a light-receiving package.

In addition to the optical package structure 10 of the first preferred embodiment as described above, the present invention may have the micro optical package structure 10', 10" made as those shown in FIG. 7 and FIG. 8, herein referred to as the second preferred embodiment and the third preferred embodiment of the present invention. As shown in FIG. 7, the micro optical package structure 10' of the second preferred embodiment is different from the first preferred embodiment for it only has the function of light emitting. The optical package structure 10' comprises the substrate 20, the light-emitting chip 30, the packaging resin body 50 and the filtration layer 60. The light-emitting chip 30 is deposited in the light-emitting area 21 of the substrate 20. The packaging resin body 50 is formed in the light-emitting area 21 and encloses the light-emitting chip 30. The filtration layer 60 is formed on the surface of the packaging resin body 50, for filtering out lights of different wavelengths. In the structure of FIG. 7, the filtration layer 60 has the light-emitting aperture 61 over the light-emitting chip 30. Thereby, lights not filtered out by the filtration layer 60 can only delivered through the light-emitting aperture 61. As shown in FIG. 8, the third preferred embodiment is different from the first preferred embodiment for it only has the function of light receiving. The optical package structure 10" comprises the substrate 20, the light-receiving chip 40, the packaging resin body 50 and the filtration layer 60. The light-receiving chip 40 is deposited in the light-receiving area 23 of the substrate 20. The packaging resin body is formed in the light-receiving area 23 and encloses the light-receiving chip 40. The filtration layer 60 is formed on the surface of the packaging resin body 50, for filtering out lights of different wavelengths. In the structure of FIG. 8, the filtration layer 60 has the light-receiving aperture 63 over the light-emitting chip 30. Thereby, the ambient lights or undesired lights can be filtered out by the filtration layer 60, and lights can only be delivered to the light-receiving chip 40 through the light-receiving aperture 63, so as to minimize interference caused by external noise.

As a conclusion, the disclosed micro optical package structure 10 and the method for making it can prevent interference caused by the light emitted by the light-emitting chip 30 from reaching the light-receiving chip 40 through scattering or diffraction without using any barriers or protective covers between or outside the packaging resin bodies, and can be microminiaturized. In addition, with the filtration layer 60 formed on the surface of each of the packaging resin bodies 50, visible lights of specific wavelengths can be filtered out without using any additional filter on the light-emitting aperture 61 or light-receiving aperture 63.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A micro optical package structure, comprising:
   a substrate, having a light-emitting area, a light-receiving area and a space between the light-emitting area and the light-receiving area;
   a light-emitting chip, being deposited in the light-emitting area;
   a light-receiving chip, being deposited in the light-receiving area;
   two packaging resin bodies, enclosing the light-emitting chip and the light-receiving chip, respectively, and being separately deposited in the light-emitting area and the light-receiving area respectively in a way that the two packaging resin bodies are separated from each other by the space; and
   two filtration layers, being formed on surfaces of the packaging resin bodies in a way that the two filtration layers are separated from each other by the space and serving to filter out lights of different wavelengths,
   wherein the packaging resin bodies each have a lateral periphery surface and a top surface, and
   wherein the lateral periphery surfaces of the packaging resin bodies are completely covered by the filtration layers, respectively, and the top surfaces of the packaging resin bodies are partially covered by the filtration layers, respectively.

2. The micro optical package structure of claim 1, wherein the filtration layers have a light-emitting aperture and a light-receiving aperture, in which the light-emitting aperture and the light-receiving aperture are over the light-emitting chip and the light-receiving chip, respectively.

3. The micro optical package structure of claim 2, wherein each of the light-emitting aperture and the light-receiving aperture is round, square or polygonal.

4. The micro optical package structure of claim 2, wherein the filtration layer is electrically conductive.

5. The micro optical package structure of claim 2, wherein the filtration layer is opaque.

6. The micro optical package structure of claim 1, wherein only one of the packaging resin bodies has a light-condensing unit or each of the packaging resin bodies has a light-condensing unit.

7. The micro optical package structure of claim 1, wherein the filtration layer has a light-emitting aperture, and the light-emitting aperture is over the light-emitting chip.

8. The micro optical package structure of claim 1, wherein the filtration layer has a light-receiving aperture, and the light-receiving aperture is over the light-receiving chip.

9. A micro optical package structure, comprising:
   a substrate, having a light-emitting area;
   a light-emitting chip, being deposited in the light-emitting area;
   a packaging resin body, being formed in the light-emitting area and enclosing the light-emitting chip, the packaging resin body having a lateral periphery surface and a top surface; and
   a filtration layer, being formed on the packaging resin body in a way that the lateral periphery surface of the packaging resin body is completely covered by the filtration layer and the top surface of the packaging resin body is partially covered by the filtration layer and serving to filter out lights of different wavelengths.

10. The micro optical package structure of claim 9, wherein the filtration layer has a light-emitting aperture, and the light-emitting aperture is over the light-emitting chip.

11. The micro optical package structure of claim 10, wherein the filtration layer is electrically conductive.

12. The micro optical package structure of claim 10, wherein the filtration layer is opaque.

13. A micro optical package structure, comprising:
a substrate, having a light-receiving area;
a light-receiving chip, being deposited in the light-receiving area;
a packaging resin body, being formed in the light-receiving area and enclosing the light-receiving chip, the packaging resin body having a lateral periphery surface and a top surface; and
a filtration layer, being formed on the packaging resin body in a way that the lateral periphery surface of the packaging resin body is completely covered by the filtration layer and the top surface of the packaging resin body is partially covered by the filtration layer and serving to filter out lights of different wavelengths.

14. The micro optical package structure of claim 13, wherein the filtration layer has a light-receiving aperture, and the light-receiving aperture is over the light-receiving chip.

15. A method for making the micro optical package structure of claim 1, the method comprising the following steps:
providing the substrate and defining the light-emitting area, the light-receiving area and the space between the light-emitting area and the light-receiving area;
providing the light-emitting chip and the light-receiving chip in the light-emitting area and the light-receiving area, respectively;
providing the packaging resin bodies to spacedly enclose the light-emitting chip and the light-receiving chip in a way that the two packaging resin bodies are separated from each other by the space and the packaging resin bodies each have a lateral periphery surface and a top surface; and
forming the two filtration layers on the surfaces of the packaging resin bodies in a way that the two filtration layers are separated from each other by the space, the lateral periphery surfaces of the packaging resin bodies are completely covered by the filtration layers, respectively, and the top surfaces of the packaging resin bodies are partially covered by the filtration layer, respectively.

16. The method of claim 15, further comprising a step of providing at least one mask on the surface of each of the packaging resin bodies, and over the light-emitting chip or the light-receiving chip, and removing the at least one mask after the filtration layers are formed.

17. The method of claim 15, further comprising a step of synchronously providing only one of the packaging resin bodies with a light-condensing unit or synchronously providing each of the packaging resin bodies with a light-condensing unit.

18. The method of claim 15, wherein the filtration layers are forming on the surfaces of the packaging resin bodies using a transfer method, an adhesion method, a coating method, a spraying method, a deposition method or a sputtering method.

19. The method of claim 15, wherein the packaging resin bodies are made using a compression-molding process to enclose the light-emitting chip and the light-receiving chip.

* * * * *